United States Patent
Puzey

(10) Patent No.: US 6,584,245 B1
(45) Date of Patent: Jun. 24, 2003

(54) HIGH SPEED DATA LINK INCLUDING A SUPERCONDUCTIVE PLATE ASSEMBLY FOR USE IN A DATA TRANSMISSION SCHEME AND METHOD

(75) Inventor: Kenneth A. Puzey, Essex Junction, VT (US)

(73) Assignee: TeraComm Research, Inc, Essex Junction, VT (US)

( * ) Notice: Subject to any disclaimer, the term of this patent is extended or adjusted under 35 U.S.C. 154(b) by 287 days.

(21) Appl. No.: 09/815,972

(22) Filed: Mar. 22, 2001

Related U.S. Application Data

(63) Continuation-in-part of application No. 09/637,098, filed on Aug. 10, 2000, now Pat. No. 6,285,487, which is a continuation of application No. 09/208,326, filed on Dec. 9, 1998, now Pat. No. 6,115,170, which is a continuation of application No. 08/643,642, filed on May 6, 1996, now Pat. No. 5,768,002.

(51) Int. Cl.[7] .............................. H04J 14/02; G02B 6/26
(52) U.S. Cl. ......................... 385/24; 385/16; 359/115; 359/124
(58) Field of Search ................................. 359/115, 124; 385/15–18

(56) References Cited

U.S. PATENT DOCUMENTS

| | | | | |
|---|---|---|---|---|
| 3,573,463 A | * | 4/1971 | Goodwin et al. | 359/114 |
| 4,943,556 A | * | 7/1990 | Szu | 505/170 |
| 5,600,465 A | * | 2/1997 | Puzey | 359/115 |
| 5,886,809 A | * | 3/1999 | Puzey | 359/278 |
| 5,963,351 A | * | 10/1999 | Kaplounenko et al. | 359/158 |

* cited by examiner

Primary Examiner—Robert H. Kim
Assistant Examiner—Krystyna Suchecki
(74) Attorney, Agent, or Firm—Yoriko Morita

(57) ABSTRACT

The high speed data link includes a light modulating device having an output, a source of light of a certain wavelength and a superconductive material, which is switchable between superconducting and non-superconducting states. This light modulating device also includes an arrangement for switching the superconductive material to provide at the output a train of light pulses having the certain wavelength. The high speed data link further includes a wavelength changing device, for changing the wavelength of the light pulses, an optical fiber, for directing the train of wavelength changed light pulses away from the wavelength changing device, and an arrangement, for receiving the train of wavelength changed light pulses. The receiving arrangement includes a demultiplexer, for dividing the train of wavelength changed light pulses into a series of sub-trains of wavelength changed light pulses, and a series of optical receivers, each optical receiver detecting at least one of the sub-trains.

60 Claims, 8 Drawing Sheets

HIGH SPEED DATA LINK INCLUDING A SUPERCONDUCTIVE PLATE ASSEMBLY FOR USE IN A DATA TRANSMISSION SCHEME AND METHOD

CROSS REFERENCE TO RELATED APPLICATION

The present application is a continuation-in-part of U.S. patent application Ser. No. 09/637,098 entitled "Light Modulation System including a Superconductive Plate Assembly for Use in a Data Transmission Scheme and Method, which is incorporated herein by reference. The aforementioned copending U.S. application Ser. No. 09/637,098 now U.S. Pat. No. 6,285,487 filed Aug. 10, 2000, is a continuation of U.S. patent application Ser. No. 09/208,326, also entitled "Light Modulation System including a Superconductive Plate Assembly for Use in a Data Transmission Scheme and Method" and now issued U.S. Pat. No. 6,115,170 filed Dec. 9, 1998, which is incorporated herein by reference. U.S. Pat. No. 6,115,170 is itself a continuation of U.S. patent application Ser. No. 08/643,642, which is now issued U.S. Pat. No. 5,768,002 filed May 6, 1996, of Puzey.

BACKGROUND OF THE INVENTION

The present invention relates generally to fiber optic communications and, more particularly, to high speed data links for use with light modulation systems including a superconductive plate assembly in a data transmission scheme.

The light modulation system as disclosed in U.S. Pat. No. 5,768,002 is capable of transmitting optical data signals at high data rates such as, for example, rates of terabits per second (Tbit/s) at a given wavelength over a single optical fiber. For example, the light modulation system can be used in a wavelength-division multiplexing (WDM) system to provide the optical data signal at a WDM channel.

However, in order to achieve a complete data link capable of handling optical data signals at a single wavelength at Tbit/s rates, an optical receiver in the data link must be able to detect the optical data signals at Tbit/s rates. Such an optical receiver singly capable of detecting Tbit/s optical data signals of a single wavelength is not commercially available at the present time to the applicant's knowledge. Although optical detectors capable of detecting optical signals at a rate of 750 GHz or with response times on the order of picoseconds or less are known in the art, these devices are still in their experimental stages hence are not yet commercialized.

Prior art data links have not had to deal with this problem of the unavailability of Tbit/s rate optical receivers because light modulation systems capable of transmitting optical data signals at Tbit/s rates at a given wavelength are not currently known at this time to the applicant's knowledge, with the exception of the light modulation system disclosed in U.S. Pat. No. 5,768,002. Existing high speed light modulation systems generally consist of a series of N light modulators, each light modulator corresponding to one channel out of N channels and producing optical data signals at rates of less than Tbit/s at a unique wavelength corresponding to a particular WDM channel out of a range of wavelengths $\lambda_1$–$\lambda_N$. The multitude of optical data signals over the range of wavelengths, each optical data signal having its own unique wavelength, are multiplexed onto an optical fiber. The multiplexed signal is received by a demultiplexer which separates the multiplexed signal into the separate optical data signals according to wavelength. The separated optical data signals are then detected by a plurality of optical detectors, each operating at less than Tbit/s rates.

The prior art data link as a whole can be made to transmit data at Tbit/s rates by using a plurality of data sources, optical sources and optical detectors all operating at Gbit/s rates. For example, if a hundred optical sources are provided (i.e., N=100), with each optical source generating an optical signal at 10 Gbit/s and at a distinct wavelength out of the wavelength range $\lambda_1$ through $\lambda_{100}$, then the aggregate optical data rate is one Tbit/s. Following transmission through an optical fiber, a WDM multiplexer combines the one hundred optical signals such that the resulting multiplexed signal contains all optical signals of the wavelength range $\lambda_1$ through $\lambda_{100}$. The WDM demultiplexer then separates the multiplexed signal into distinct wavelengths to be detected by a hundred optical detectors, each detector operating at 10 Gbits/s. As a result, it is possible to transmit data using the prior art data link at an aggregate rate of 1 Tbit/s.

It is submitted, however, the aforedescribed prior art data link has a number of disadvantages. In order to increase the total data transmission rate of the prior art data link above approximately 1 Tbit/s, the number of channels, and hence the number of data sources and optical sources used in the data link, must be increased. This condition may be satisfied by narrowing the wavelength differences between channels thus fitting more channels into a given wavelength range $\lambda_1$ through $\lambda_N$ and/or widening the wavelength range between $\lambda_1$ and $\lambda_N$. However, narrowing the wavelength differences between the channels increases the probability of data transmission error due to potential optical signal overlap and crosstalk and puts a greater demand on the WDM demultiplexer to accurately separate the optical signals into the distinct wavelengths. As is well known in the art, there is only a finite range available for use as the wavelength range $\lambda_1$ through $\lambda_N$, outside of which significant optical signal loss occurs due to the material properties of the optical fiber as well as other components of an optical communication system, such as repeaters and amplifiers. Therefore, the wavelength range cannot be widened indefinitely using currently available technology, hence it is difficult to increase the number of channels to increase the data transmission rate. Furthermore, increasing the number of different wavelengths traveling simultaneously through the optical fiber also increases the probability of occurrence of undesired, nonlinear optical effects during transmission. Care must be taken to avoid such nonlinear optical effects, thus adding to the overall complexity and cost of this prior art data link at faster data transmission rates. Still further, WDM channels require a guard band on either side of the specific channel wavelength in order to reduce wavelength overlap and crosstalk between channels. Since no data can be transmitted on the guard band, the wavelengths used in the guard band are essentially wasted bandwidth.

The present invention provides a high speed data link which serves to resolve the problems described above with regard to prior art data links in a heretofore unseen and highly advantageous way and which provides still further advantages.

SUMMARY OF THE INVENTION

As will be described in more detail hereinafter, there is disclosed herein a high speed data link including a transmitting arrangement having a transmitter output. The transmitting arrangement includes a source of light having a certain wavelength. The transmitting arrangement further includes a layer of superconductive material through which the light from the source must pass before the light can reach the transmitter output. The superconductive material is switchable between a superconducting state in which,the light cannot pass therethrough and a non-superconducting state in which the light can pass therethrough. Still further, the transmitting arrangement includes an arrangement for switching the superconductive material between its superconducting and non-superconducting states to provide a train of light pulses having the certain wavelength and containing optical data. The transmitting arrangement further includes a wavelength changing device, which is optically coupled to the layer of superconductive material, for changing the wavelength of the light pulses and providing a train of wavelength changed light pulses containing optical data at the transmitter output. The high speed data link also includes an optical fiber, one end of which is optically coupled to the transmitter output, for directing the train-of wavelength changed light pulses away from the transmitting arrangement. Additionally, the high speed data link includes a receiving arrangement optically coupled to an opposing end of the optical fiber. The receiving arrangement includes an all-optical demultiplexer for dividing the train of wavelength changed light pulses into a series of sub-trains of wavelength changed light pulses. The receiving arrangement further includes a series of optical receivers, each optical receiver being designed to detect at least one of the sub-trains of wavelength changed light pulses out of the series of sub-trains of wavelength changed light pulses.

In another aspect of the invention, the transmitting arrangement of the high speed data link includes a series of light modulating devices for generating a series of trains of light pulses over a specified range of wavelengths. Each light modulating device has a light output and provides at its output one of the trains of light pulses, and the light pulses of each train of light pulses have an assigned wavelength out of the specified range of wavelengths. Each light modulating device includes a source of light having a given wavelength and a layer of superconductive material through which the light from the source must pass before the light can reach the light output of that light modulating device. The superconductive material is switchable between a superconducting state in which the light cannot pass therethrough and a non-superconducting state in which the light can pass therethrough. Each light modulating device further includes an arrangement for switching the superconductive material between its superconducting and non-superconducting states to provides a train of light pulses having the given wavelength and containing optical data. In addition, each light modulating device includes a wavelength changing device, optically coupled to the layer of superconductive material, for changing the wavelength of the light pulses from the given wavelength into the assigned wavelength and providing a train of wavelength changed light pulses containing optical data at the light output such that no two light modulating devices in the series of light modulating devices generate trains of light pulses at the same assigned wavelength out of the specified range of wavelengths. The transmitting arrangement further includes a WDM multiplexer optically coupled to the light outputs of the series of light modulating devices for reading the series of trains of wavelength changed light pulses in parallel and combining the series of trains of wavelength changed light pulses into a multiplexed signal at the transmitter output of the transmitting arrangement. An optical fiber, one end of which is optically coupled to the transmitter output, directs the multiplexed signal away from the transmitting arrangement. The high speed data link further includes a receiving arrangement including a WDM demultiplexer, optically coupled to an opposing end of the optical fiber, for receiving the multiplexed signal and separating the multiplexed signal back into the series of trains of wavelength changed light pulses. Further, the receiving arrangement includes a series of light receiving devices configured to receive the series of trains of wavelength changed light pulses. Each of the receiving arrangements is optically coupled to the WDM demultiplexer and is designed to receive at least one of the trains of wavelength changed light pulses of a particular wavelength out of the specified range of wavelengths. Moreover, each of the receiving arrangements includes an all-optical demultiplexer for dividing the train of wavelength changed light pulses into a series of sub-trains of wavelength changed light pulses. Additionally, each of the receiving arrangements further includes a series of optical receivers, each of which is designed to detect at least one of the sub-trains of wavelength changed light pulses out of the series of sub-trains of wavelength changed light pulses.

In still another aspect of the invention, a method for providing a high speed data link is disclosed. Accordingly, a train of light pulses containing optical data is transmitted. In this transmitting step, light having a certain wavelength is generated and directed onto a layer of superconductive material, which is switchable between a superconducting state in which the light cannot pass therethrough and a non-superconducting state in which the light can pass therethrough. The superconductive material is switched between its superconducting and non-superconducting states for generating a train of light pulses having the certain wavelength . The wavelength of the light pulses is then changed to provide a train of wavelength changed light pulses containing optical data. The train of wavelength changed light pulses is directed to a desired location then received at the desired location and divided into a series of sub-trains of wavelength changed light pulses. Additionally, the series of sub-trains of wavelength-changed light pulses are detected using a series of optical receivers, each of which is designed to detect at least one of the sub-trains of wavelength changed light pulses out of the series of sub-trains of wavelength changed light pulses.

In yet another aspect of the invention, an alternative method for providing a high speed data link is disclosed. Accordingly, a multiplexed signal containing optical data is transmitted. In this transmitting step, light of a given wavelength is generated and directed onto a layer of superconductive material, which is switchable between a superconducting state in which the light cannot pass therethrough and a non-superconducting state in which the light can pass therethrough. The superconductive material is switched between its superconducting and non-superconducting states for generating a train of light pulses having the given wavelength and containing optical data. The wavelength of the light pulses is changed from the given wavelength to an assigned wavelength out of a specified range of wavelengths. The steps of light generation, switching of the superconductive material and wavelength changing are repeated to provide a series of trains of wavelength changed light pulses, each of which trains of wavelength changed light pulses contains optical data and has a distinct, assigned wavelength out of the specified range of wavelengths in such a way that no two trains of wavelength changed light pulses in the series of trains of wavelength changed light pulses have the same assigned wavelength out of the specified range of wavelengths. The series of trains of wavelength changed light pulses are read in parallel and combined into a multiplexed signal containing optical data. The multiplexed signal is directed to a desired location and received at the desired location where the received, multiplexed signal is separated back into the series of trains of wavelength changed light pulses. Each of the trains of wavelength changed light pulses is divided into a series of sub-trains of wavelength changed light pulses. The series of sub-trains of wavelength is detected using a series of optical receivers, each which is designed to detect at least one of the sub-trains of wavelength changed light pulses out of the series of sub-trains of wavelength changed light pulses of a particular, assigned wavelength out of the specified range of wavelengths.

In still yet another aspect of the present invention, an optical communication system for use with a communication satellite is disclosed. The optical communication system includes means for transmitting a train of light pulses containing optical data. Transmitting means has a transmitter output and includes a source of light having a certain wavelength and a layer of superconductive material through which the light from the source must pass before the light can reach the transmitter output. The superconductive material is switchable between a superconducting state in which the light cannot pass therethrough and a non-superconducting state in which the light can pass therethrough. Transmitting means also includes an arrangement for switching the superconductive material between the superconducting and non-superconducting states for providing a train of light pulses having the certain wavelength and containing optical data. Transmitting means also includes a wavelength changing device optically coupled to the layer of superconductive material for changing the wavelength of the light pulses and providing a train of wavelength changed light pulses containing optical data at the transmitter output. The optical communication system also includes means for directing the train of wavelength changed light pulses from the transmitter output to the communication satellite, which redirects the train of wavelength changed light pulses toward a desired location, and means for intercepting the train of redirected, wavelength changed light pulses from the satellite at the desired location. The optical communication system further includes means for receiving the train of redirected, wavelength changed light pulses intercepted by the intercepting means. Receiving means includes an all-optical demultiplexer for dividing the train of redirected, wavelength changed light pulses into a series of sub-trains of wavelength changed light pulses and a series of optical receivers, each of which is designed to detect at least one of the sub-trains of wavelength changed light pulses out of the series of sub-trains of wavelength changed light pulses.

BRIEF DESCRIPTION OF THE DRAWINGS

The present invention may be understood by reference to the following detailed description taken in conjunction with the drawings briefly described below.

DETAILED DESCRIPTION

Figure 1:
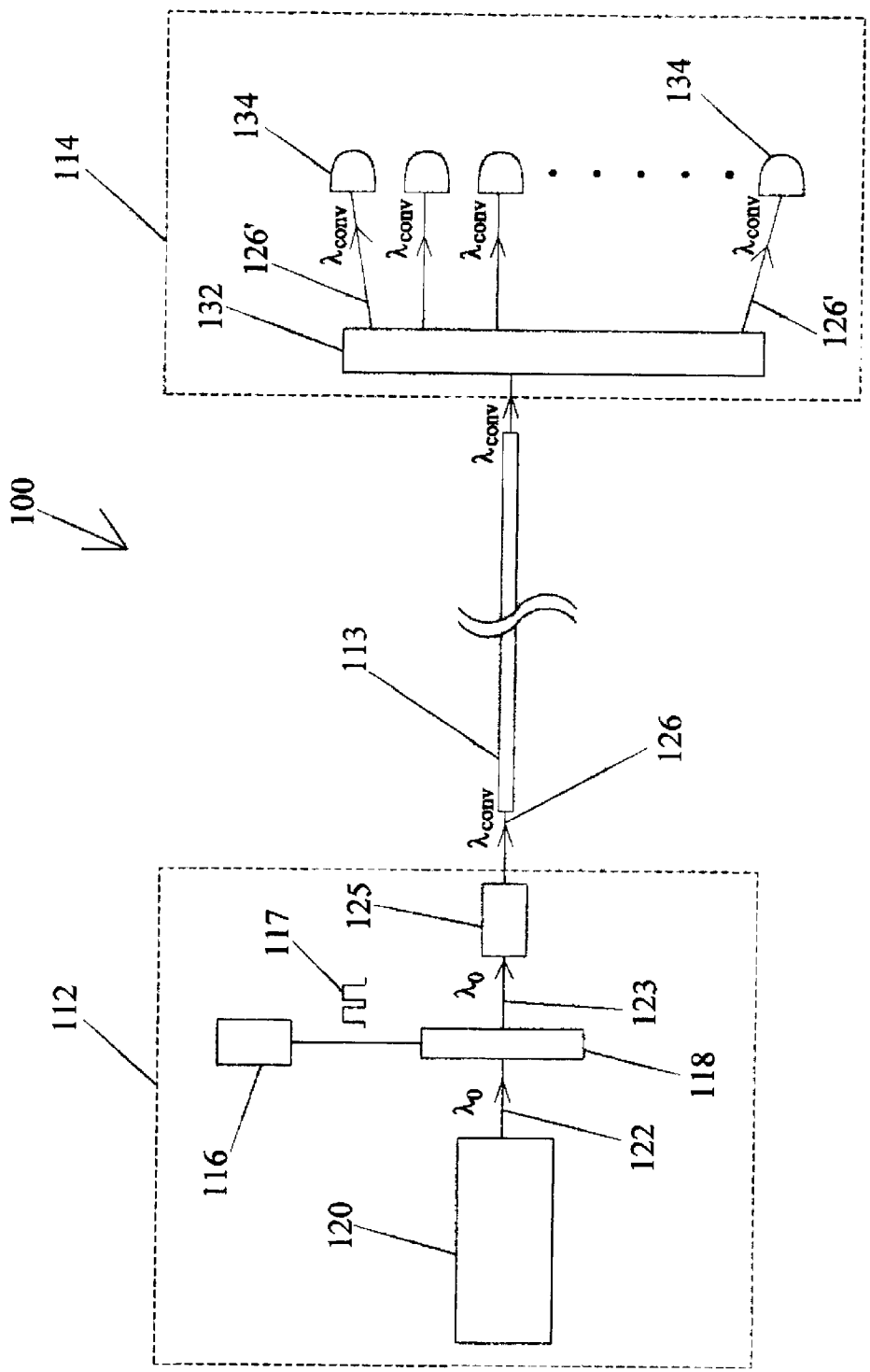
FIG. 1 is a diagrammatic illustration of a data link designed in accordance with the present invention and employing a superconducting layer and a wavelength converting device to modulate light.

Turning now to the drawings, wherein like components are indicated by like reference numbers throughout the various figures, attention is immediately directed to FIG. 1, which illustrates one embodiment of a high speed data link, generally indicated by the reference numeral 100, fabricated in accordance with the present invention. Data link 100 includes a transmitter arrangement 112, optical fiber 113 and receiver arrangement 114. Transmitter arrangement 112 includes a data source 116 which provides data input 117 to a superconducting arrangement 118. Data source 116 can be, for example, a high speed modulating circuit, electronic signal generator, serializer, SONET Add/Drop multiplexer, ATM switch or a combination thereof. Superconducting arrangement 118 is switched between a normal state and a superconducting state according to data input 117. A light source 120 is used to generate light 122 at a wavelength $\lambda_0$ directed toward superconducting arrangement 118. Light source 120 may be a laser, light emitting diode, etc., as is commonly known in the art. By way of example and not a limitation, a quantum cascade (QC) laser is suitable for use as light source 120. QC lasers are capable of emitting light over a variety of infrared wavelengths that are compatible with superconducting arrangement 118, ranging from a few microns to tens of microns at high peak powers of hundreds of milliwatts (See, for example, A. Tredicucci, et al, "High-power inter-miniband lasing in intrinsic superlattices," Applied Physics Letters, 72 (19), pp. 2388–2390). QC lasers are also tunable, thus allowing more flexibility in the specification of superconducting arrangement 118. Other examples of appropriate light sources include a bismuth antimony BiSb laser (see, for example, A. G. Alksanyan, et al, "Semiconductor laser made of $Bi_{1-x}Sb_x$," Soviet Journal of Quantum Electronics, vol. 14, no. 3, pp. 336–8), germanium laser and gas lasers, such as a laser including a carbon dioxide-pumped cavity with methanol.

Continuing to refer to FIG. 1, superconducting arrangement 118 is designed in such a way that it is transparent to light of wavelength $\lambda_0$ when it is in its normal state, and blocks the transmission of light of wavelength $\lambda_0$ when it is in its superconducting state. As a result, light 122 is blocked or transmitted according to data input 117, and light 122 is modulated by superconducting arrangement 118 to produce a series of optical pulses 123 at wavelength $\lambda_0$. The details of the switching mechanism of superconducting arrangement 118 are described in detail in U.S. Pat. No. 5,768,002.

Still referring to FIG. 1, it should be noted that the wavelength $\lambda_0$ of light 122 and optical pulses 123 is chosen such that wavelength $\lambda_0$ is transmitted or blocked by superconducting arrangement 118 depending on whether superconducting arrangement 118 is in its normal or superconducting state. As described in U.S. Pat. No. 5,768,002, superconducting arrangement 118 can perform the function of encoding data input 117 as optical pulses 123 when the wavelength $\lambda_0$ is in the far infrared (IR) range (approximately 14 $\mu$m or greater). For example, the wavelength $\lambda_0$=25 $\mu$m is chosen in the embodiment of the present invention shown in FIG. 1. Unfortunately, since light of far IR wavelengths attenuate rapidly during transmission through conventional, silica glass optical fiber, it is not practical to directly transmit optical pulses of far IR wavelengths through the optical fiber 113. To counter this problem, optical pulses 123 are directed into a wavelength converting device 125, which converts optical pulses 123 at the wavelength $\lambda_0$ into optical pulses 126 at a shorter wavelength $\lambda_{conv}$. The wavelength $\lambda_{conv}$ are in the range of approximately 0.5 to 2 µm, preferably on the order of 1.3 or 1.5 µm so as to be compatible with conventional optical fibers. Optical pulses 126 are then directed into one end of optical fiber 113.

Optical pulses 126 shown in FIG. 1 are received at an opposing end of optical fiber 113 by receiving arrangement 114. Receiving arrangement 114 includes an all-optical (AO) demultiplexer 132. AO demultiplexer 132 divides optical pulses 126 into a plurality of low data rate, optical pulses 126' also with wavelength $\lambda_{conv}$. Then, each set of divided, low data rate, optical pulses 126' are detected by an optical detector 134. For example, AO demultiplexer 132 can be designed to divide optical pulses 126 such that a first data bit goes to a first optical detector, a second data bit goes to a second optical detector, and so on. The optical detectors are, for example, a plurality of interchangeable, generic detectors designed to be sensitive to light of wavelength $\lambda_{conv}$. Therefore, while transmitter arrangement 112 generates optical data signals at Tbit/s rates at wavelength $\lambda_{conv}$, receiver arrangement 114 is able to detect the Tbit/s rate optical data signals using Gbit/s detectors by dividing optical pulses 126 into slower optical pulses 126', thus achieving Tbit/s rate transmission through data link 100.

Data link 100 takes advantage of the high data rate that is possible with a transmitter arrangement based on a superconducting arrangement to provide a complete, high speed data link. Transmitter arrangement 112 as shown in FIG. 1 is capable of encoding data input 117 onto optical pulses 126 of wavelength $\lambda_{conv}$ at data rates of approximately 1 Tbit/s. Unlike the aforementioned prior art data link which requires a plurality of data sources and optical sources operating simultaneously at different wavelengths to achieve an aggregate data transmission rate of 1 Tbit/s, transmitter arrangement 112 is singly capable of transmitting optical data in the form of optical pulses at 1 Tbit/s rates at a single wavelength. It is submitted that this feature of optical source 10 is highly advantageous in at least one respect since, by splitting optical pulses 126 into low data rate, optical pulses 126', receiver arrangement 114 is able to detect the high data rate, optical pulses 126 using a series of low speed detectors without the need to use multiple wavelengths and a WDM demultiplexer.

It should also be understood that only one wavelength, wavelength $\lambda_{conv}$, is transmitted through optical fiber 113 of data link 100 illustrated in FIG. 1. Therefore, potential problems associated with the prior art data such as crosstalk and nonlinear optical effects due to the presence of multiple wavelengths in the optical fiber are eliminated in data link 100. Furthermore, data link 100 does not require the use of a guard band, thus the available bandwidth outside of wavelength $\lambda_{conv}$ is not wasted.

An additional advantage associated with data link 100 resides in the fact that data link 100 is readily up-scalable. Since the overall, data transmission rate depends mainly on the speed at which superconducting arrangement 118 can be modulated, as faster materials or switching schemes are developed for the superconducting arrangement such that transmitter arrangement 112 produces higher rate optical pulses 126, additional optical detectors 134 can be added in receiver arrangement 114 to accommodate the increased data rate without a need to develop faster optical detectors than are currently available commercially today. As faster optical detectors do become available, the number of optical detectors may be accordingly decreased, thus potentially simplifying the high speed data link of the present invention.

Figure 2:
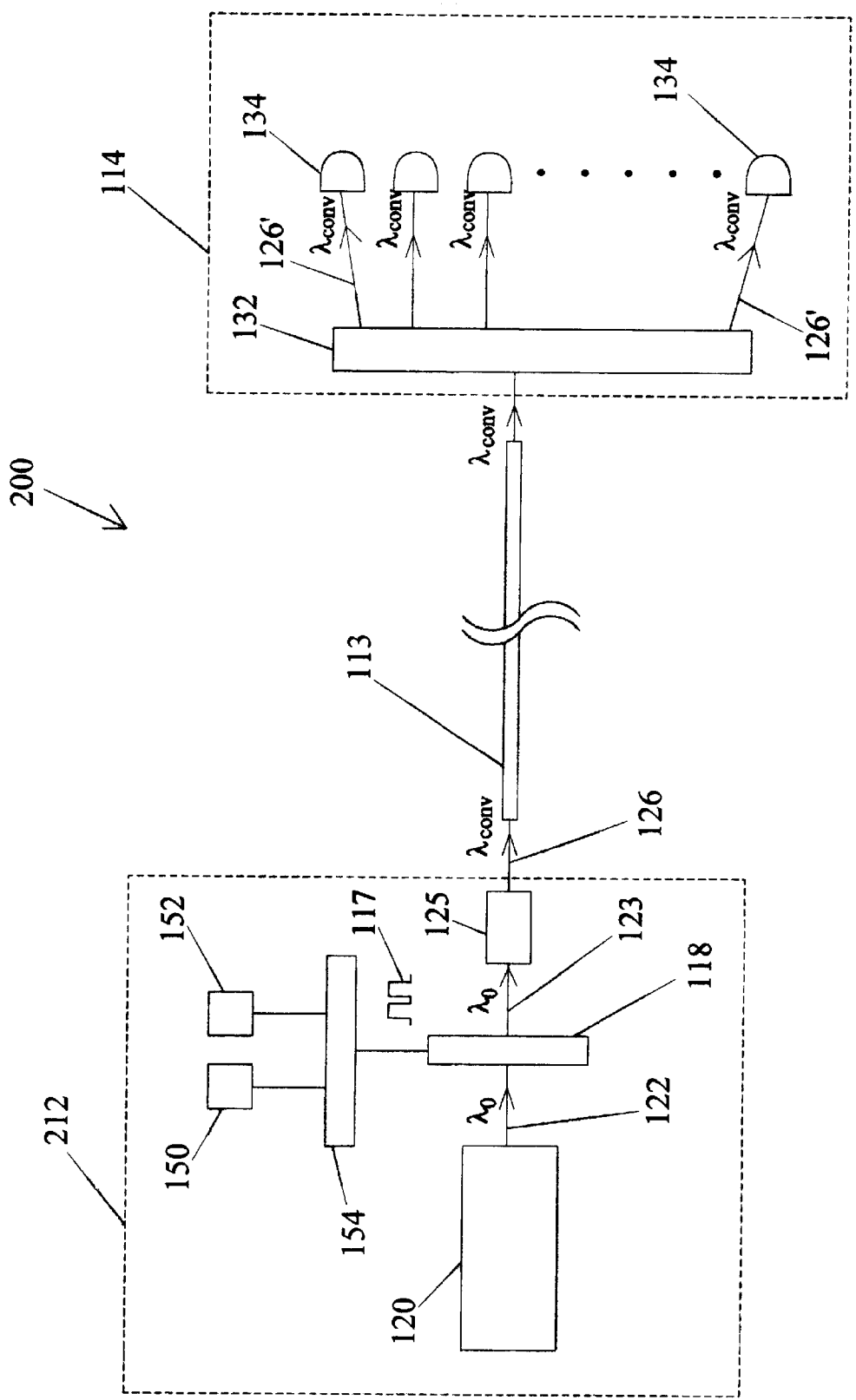
FIG. 2 is a diagrammatic illustration of an alternative embodiment of a data link designed in accordance with the present invention.

Attention is now directed to FIG. 2 in conjunction with FIG. 1. FIG. 2 illustrates another data link produced in accordance with the present invention, generally indicated by the reference number 200. Data link 200 includes a transmitter arrangement 212 as well as optical fiber 113 and receiver arrangement 114, the latter two components being essentially identical to the corresponding components of data link 100 illustrated in FIG. 1 with like reference numbers. Therefore, the discussion of data link 200 will concentrate on transmitter arrangement 212 which is modified with respect to transmitter arrangement 112 of data link 100.

Like transmitter arrangement 112 of FIG. 1, transmitter arrangement 212 shown in FIG. 2 includes light source 120 which generates light 122 of wavelength $\lambda_0$ directed towards superconducting arrangement 118. Superconducting arrangement 118 is switched between its normal and superconducting states according to data input 117, thus generating optical pulses 123 of wavelength $\lambda_0$. Optical pulses 123 are directed into wavelength converting device 125 which converts optical pulses 123 of wavelength $\lambda_0$ into optical pulses 126 of wavelength $\lambda_{conv}$.

However, the way in which data input 117 is generated is different in transmitter arrangement 212 as compared to that of transmitter arrangement 112. Transmitter arrangement 212 includes a plurality of optical transmitters 150 and 152 arranged to transmit optical modulation pulses in parallel into an optoelectronic (OE) multiplexer 154. OE multiplexer 154 reads the optical modulation pulses in parallel then serializes the electrical data from the optical modulation pulses, thus generating data input 117. It should be noted that data input 117 is a serial, electrical signal. For example, commercially-available, 10 Gbit/s optical transmitters, which are well-known in the art, are suitable for use as optical transmitters 150 and 152. OE multiplexer 154 can be designed to generate data input 117 at rates of one Tbit/s or higher depending on the number of optical transmitters used. In this way, slower optical transmitters can be multiplexed to generate high speed data signals for switching superconducting arrangement 118, and optical pulses 126 are generated at rates of Tbit/s or higher. OE multiplexer 154 is, for instance, a multiplexer based on Josephson Junction circuitry. Alternatively, the plurality of optical transmitters 150 and 152 and OE multiplexer 154 is replaceable by a system of a plurality of fiber optic transmitters, receivers, optical fibers and a high speed shift register, as described in U.S. Pat. No. 5,768,002.

Figure 3:
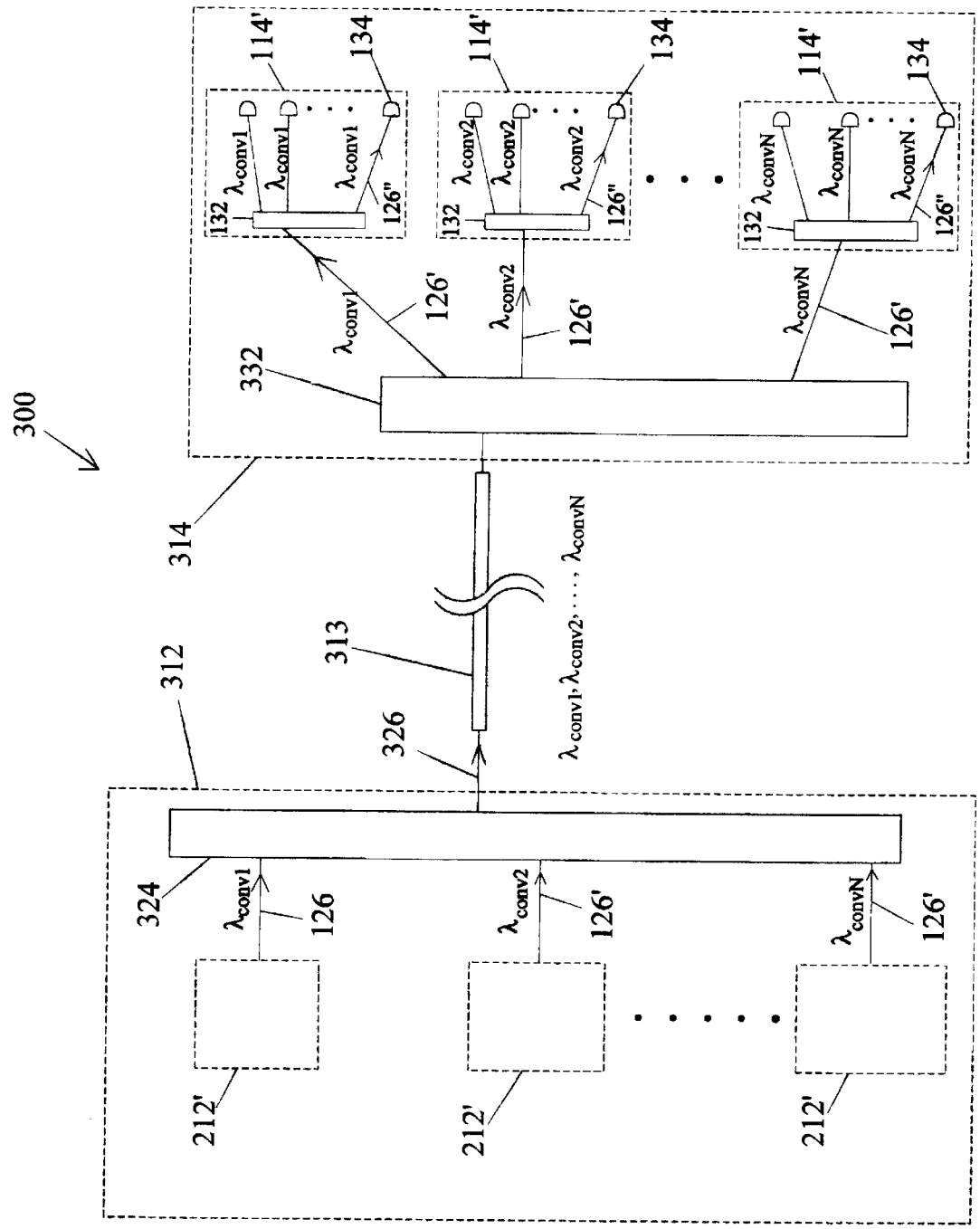
FIG. 3 is a diagrammatic illustration of yet another embodiment of a data link manufactured in accordance with the present invention.

Referring now to FIG. 3, a diagrammatic illustration of still another embodiment of a data link manufactured in accordance with the present invention, generally indicated by reference numeral 300, is shown. Data link 300 includes a transmitter arrangement 312, an optical fiber 313 and a receiver arrangement 314. Transmitter arrangement 312 includes a series of optical transmitters 212'. Each optical transmitter 212' is identical to transmitter arrangement 212 illustrated in FIG. 2 with a modification that optical transmitter 212' is designed to generate optical pulses 126' of a particular wavelength out of the wavelength range $\lambda_{conv1}$ to $\lambda_{convN}$ in such a way that no two optical transmitters generate optical pulses 126' at the same wavelength. As described in the discussion of FIG. 2, each optical transmitter 212' is capable of generating optical pulses 126' at rates of Tbit/s or higher.

The series of optical pulses 126' are directed into a WDM multiplexer 324 which combines the series of optical pulses 126' such that the series of optical pulses 126', each set of optical pulses 126' having a distinct wavelength out of the wavelength range $\lambda_{conv1}$ to $\lambda_{convN}$, are together directed into optical fiber 313 as optical pulses 326. Optical pulses 326 contains all sets of optical pulses 126' such that all optical data encoded into the series of optical pulses 126' are transmitted down optical fiber 313 simultaneously. In this way, optical pulses 326 carries optical data signals at an aggregate rate which is greater than Tbit/s.

Optical pulses 326 are transmitted through optical fiber 313 and into receiver arrangement 314, where optical pulses 326 are received by a WDM demultiplexer 332. WDM demultiplexer 332 separates optical pulses 326 back into the series of optical pulses 126' according to wavelength. Each set of optical pulses 126' is directed into an optical receiver 114', which is identical to receiver arrangement 114 of FIG. 1 with a modification that AO demultiplexer 132 is designed to divide a set of optical pulses 126' of at least one particular wavelength out of the wavelength range $\lambda_{conv1}$ to $\lambda_{convN}$ into a plurality of low data rate, optical pulses 126". Thus, each optical receiver 114' is capable of receiving optical pulses 126' at rates of Tbit/s or higher. Furthermore, by using a WDM demultiplexer and a plurality of wavelengths with each wavelength carrying optical data at rates of Tbit/s, receiver arrangement 314 is able to receive optical data at an aggregate rate of much higher than Tbit/s.

Figure 4A:
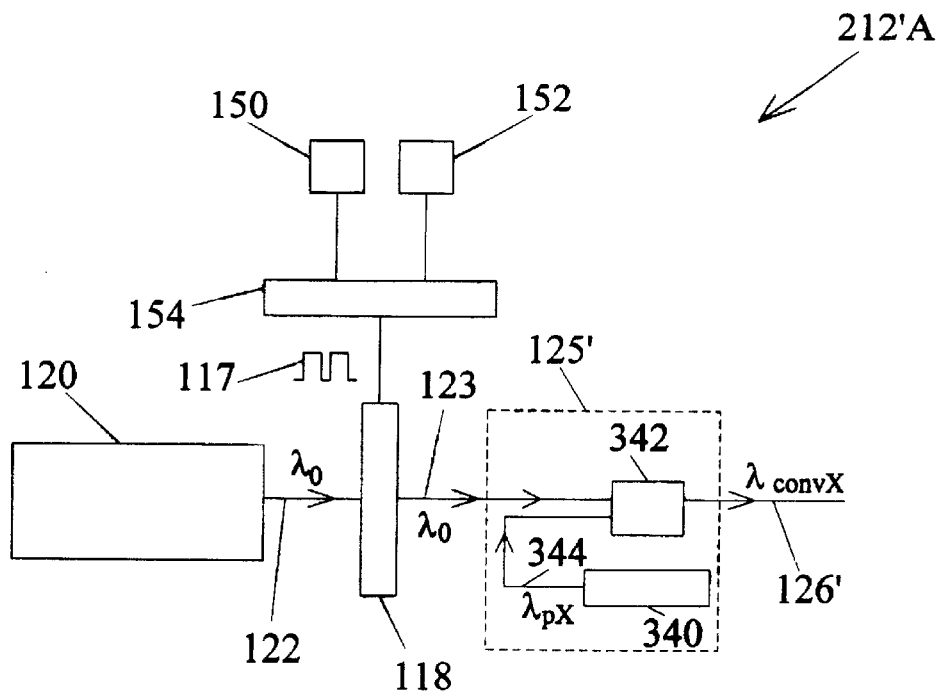
FIGS. 4A and 4B are diagrammatic illustrations of alternative embodiments of an optical transmitter as shown in FIG. 3.
Figure 4B:
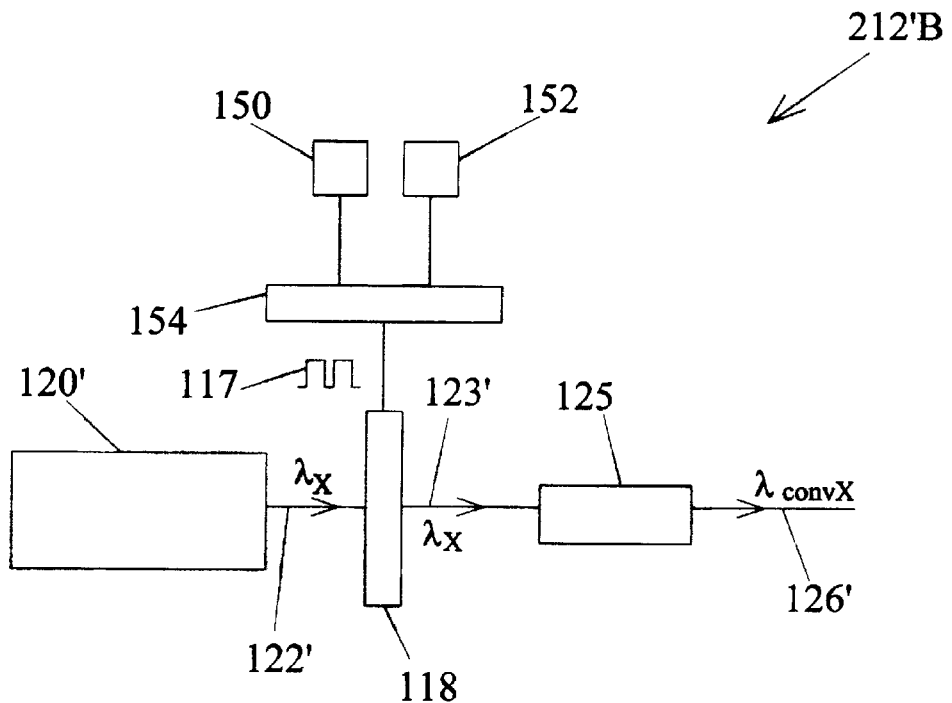

Turning to FIGS. 4A and 4B, two possible alternatives for the optical transmitter 212' are illustrated. Although two specific schemes for the optical transmitter are shown, these configurations are not to be considered as limiting. Various modifications may be made to the optical transmitter alternatives shown in FIGS. 4A and 4B while keeping with the spirit of the present invention.

FIG. 4A is a diagrammatic illustration of an optical transmitter 212'A, which is the $X^{th}$ optical transmitter in a series of N optical transmitters. Optical transmitter 212'A includes a wavelength converting device 125' with a pump laser 340 and a nonlinear optical crystal 342. Pump laser 340 provides a pump beam 344 of a predetermined wavelength $\lambda_{pX}$ directed at nonlinear optical crystal 342. Optical pulses 123 from superconducting arrangement 118 are also incident on nonlinear optical crystal 342. Since the specific wavelength generated by the wavelength converting device 125' depends on the material characteristics of nonlinear optical crystal 342 and the wavelength of pump laser 340, the predetermined wavelength $\lambda_{pX}$ of pump beam 344 is selected such that optical pulses 123 of wavelength $\lambda_0$ are converted into optical pulses of a particular wavelength $\lambda_{convX}$ out of the wavelength range $\lambda_{conv1}$ to $\lambda_{convN}$. By using identical nonlinear optical crystals 342 in all optical transmitters 212' and selecting a suitable pump laser wavelength $\lambda_{pX}$ for each wavelength converting device 125', the series of optical transmitters 212' are designed in such a way that each optical transmitter 212' generates optical pulses 126' of a particular wavelength out of the wavelength range $\lambda_{conv1}$ to $\lambda_{convN}$ and no two optical transmitters generate optical pulses 126' at the same wavelength. For example, each optical transmitter 212' is equipped with a distinct pump laser which lases at the specific pump wavelength $\lambda_{pX}$. Alternatively, every optical transmitter 212' is equipped with an identical, tunable pump laser and each tunable pump laser is programmed at the factory or in the field to the appropriate wavelength $\lambda_{pX}$. In yet another implementation, all wavelength converting devices includes identical pump lasers and a suitable nonlinear optical crystal can be selected for each wavelength converting device 125' such that that each optical transmitter 212' generates optical pulses 126' of wavelength $\lambda_{convX}$ out of the wavelength range $\lambda_{conv1}$ to $\lambda_{convN}$ and no two optical transmitters generate optical pulses 126' at the same wavelength. As another possibility, all wavelength converting devices may include identical pump lasers and nonlinear optical crystals, with each nonlinear optical crystal being provided with, for example, a temperature and/or current control device to tune the material properties of the nonlinear optical crystal such that that each optical transmitter 212' generates optical pulses 126' of wavelength $\lambda_{convX}$ out of the wavelength range $\lambda_{conv1}$ to $\mu_{convN}$ and no two optical transmitters 212'A generate optical pulses 126' at the same wavelength. It should be noted that all components (other than wavelength converting device 125') of optical transmitter 212'A are essentially the same as those of optical transmitter 212 shown in FIG. 2.

An alternative scheme for an optical transmitter is shown in FIG. 4B, generally indicated by reference numeral 212'B. Each optical transmitter 212'B in this case is equipped with a generic, tunable laser as light source 120' which emits light 122' of wavelength $\lambda_X$, where X=an integer between 1 and N corresponding to the $X^{th}$ optical transmitter 212'B. All components (other than light source 120') of optical transmitter 212'B are identical to those of optical transmitter 212 shown in FIG. 2. Light 122' is directed at superconducting arrangement 118, which in turn produces optical pulses 123' of wavelength $\lambda_X$. Each optical transmitter 212'B in the series of optical transmitters is provided with a generic wavelength converting device 125. The wavelength $\lambda_X$ of light 122' produced at tunable laser of each optical transmitter 212'B is then tuned to provide light of a distinct wavelength such that wavelength converting device 125 converts the wavelength $\lambda_X$ of optical pulses 123' into optical pulses 126' of a particular wavelength $\lambda_{convX}$ out of the wavelength range $\lambda_{conv1}$ to $\lambda_{convN}$ and no two optical transmitters 212'B generate optical pulses 126' at the same wavelength. The aforementioned QC laser is an example of a light source which is suitable for use as the tunable laser in this configuration. A bismuth laser, antimonide laser, germanium laser or a gas laser, such as a laser including a carbon dioxide-pumped cavity with methanol, may also be used in conjunction with an appropriate tuning mechanism (such as a temperature, current and/or magnetic field controller).

It should be noted that the use of a tunable pump laser as pump laser 340 as shown in FIG. 4A or a tunable laser as light source 120' as shown in FIG. 4B adds a routing capability to data link 300 of FIG. 3. By tuning the output wavelength of the series of optical transmitters 212' in data link 300, it is possible to direct data from any optical transmitter 212' to any optical receiver 114', thus routing the transmitted data to the desired recipient.

Returning to FIG. 3, although data link 300 uses a plurality of wavelengths as in the aforedescribed prior art data link, it is submitted that data link 300 has advantages over the prior art data link. Since data link 300 is capable of transmitting at Tbit/s data rates on each train of wavelength converted optical pulses 126', the selection of specific wavelengths out of the wavelength range $\lambda_{conv1}$ to $\lambda_{convN}$ is more flexible than in prior art data links, which depend on the packing of as many channels as possible into the limited wavelength range. Data link 300 can achieve multiple Tbit/s data rates with fewer constraints on the wavelengths chosen such that the wavelengths and channel spacings used can be specifically selected to reduce problems such as cross talk and nonlinear optical effects. In addition, although data link 300 requires the use of a guard band on either side of each channel wavelength, the fast data rate capability at each channel and the flexibility in wavelength selection allow more efficient use of the available bandwidth and higher data rates as compared to prior art WDM data links.

Figure 5A:
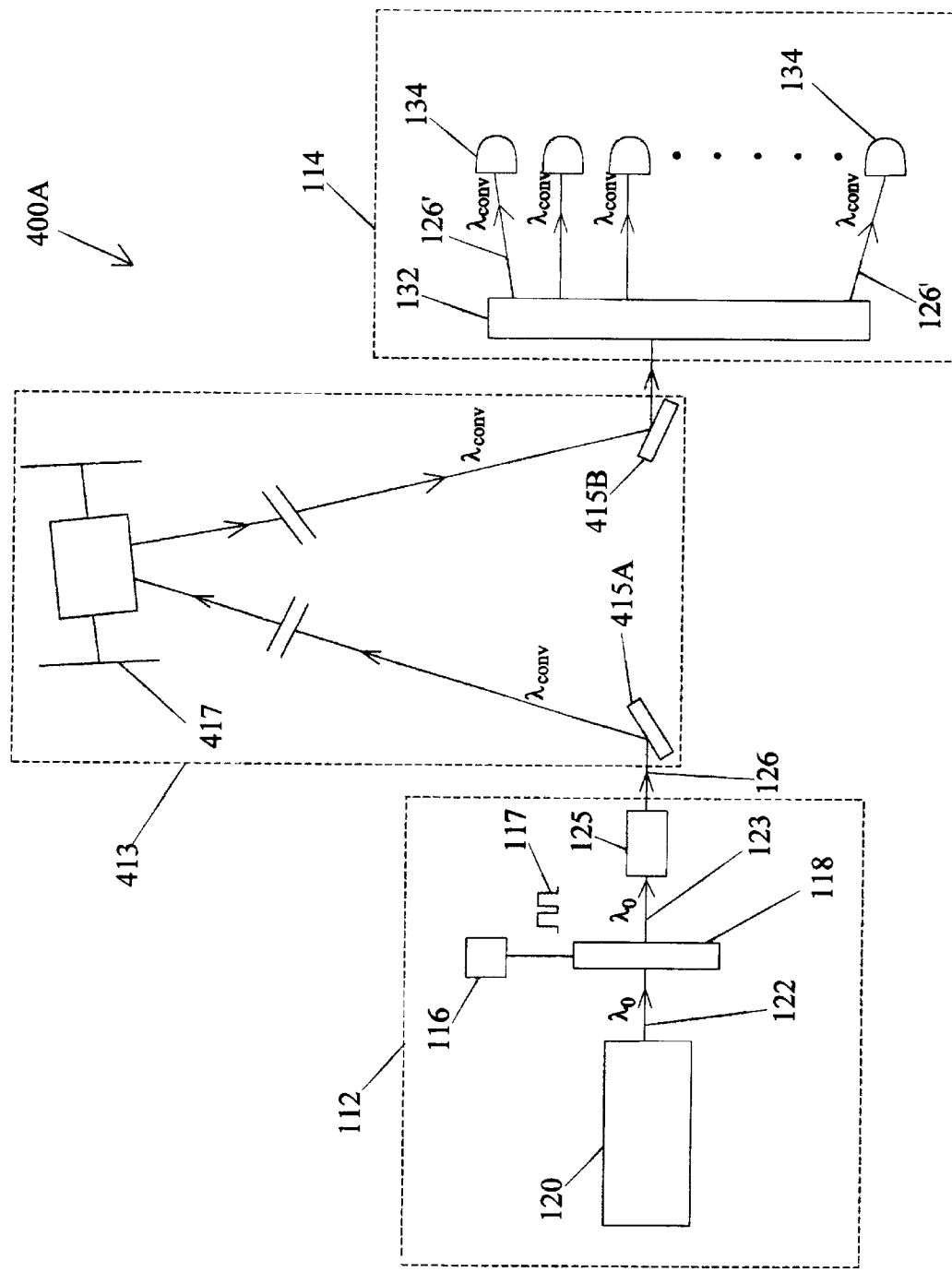
FIGS. 5A, 5B and 5C are diagrammatic illustrations of alternative embodiments of an optical communication system designed in accordance with the present invention.
Figure 5B:
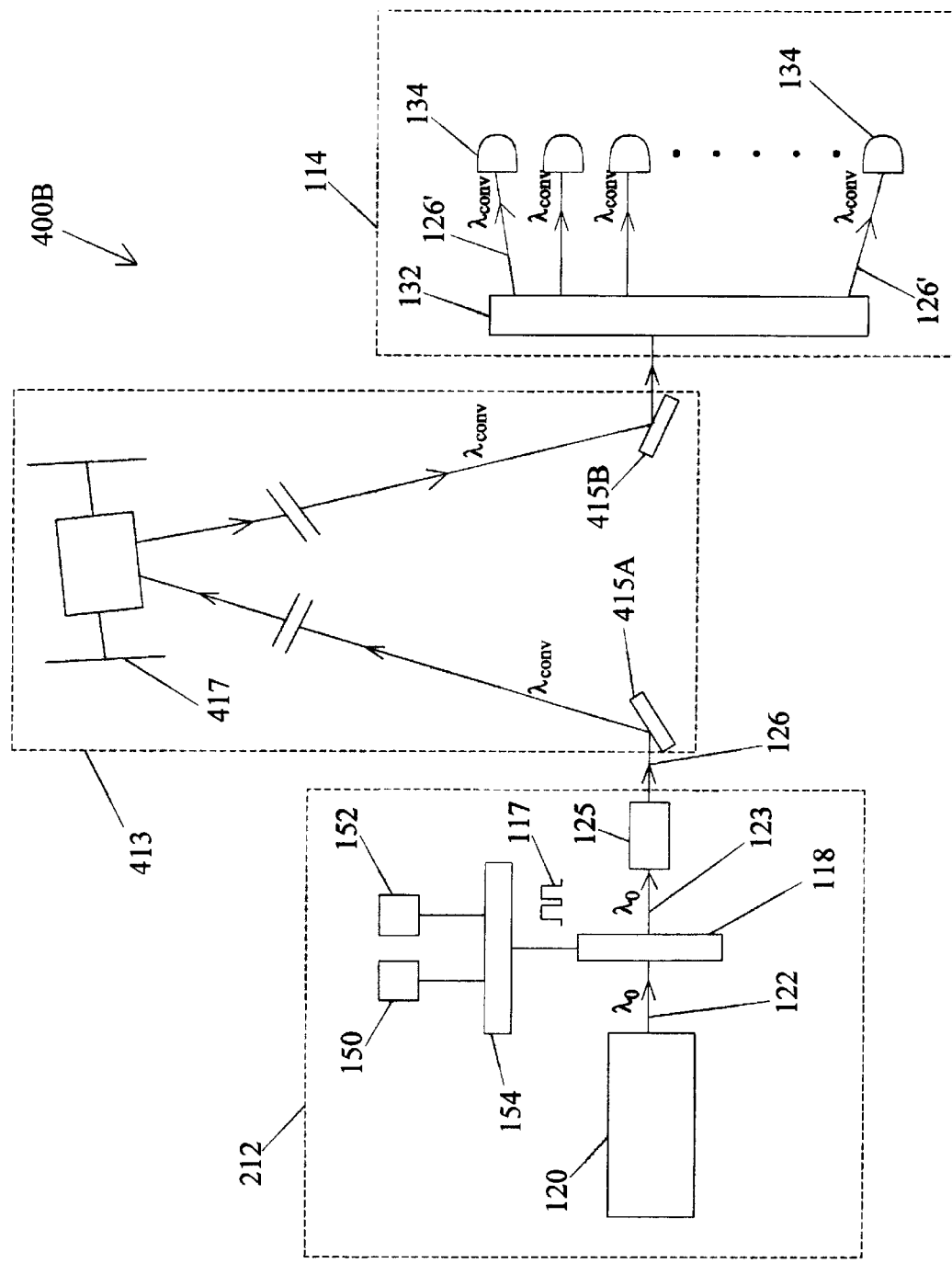
Figure 5C:
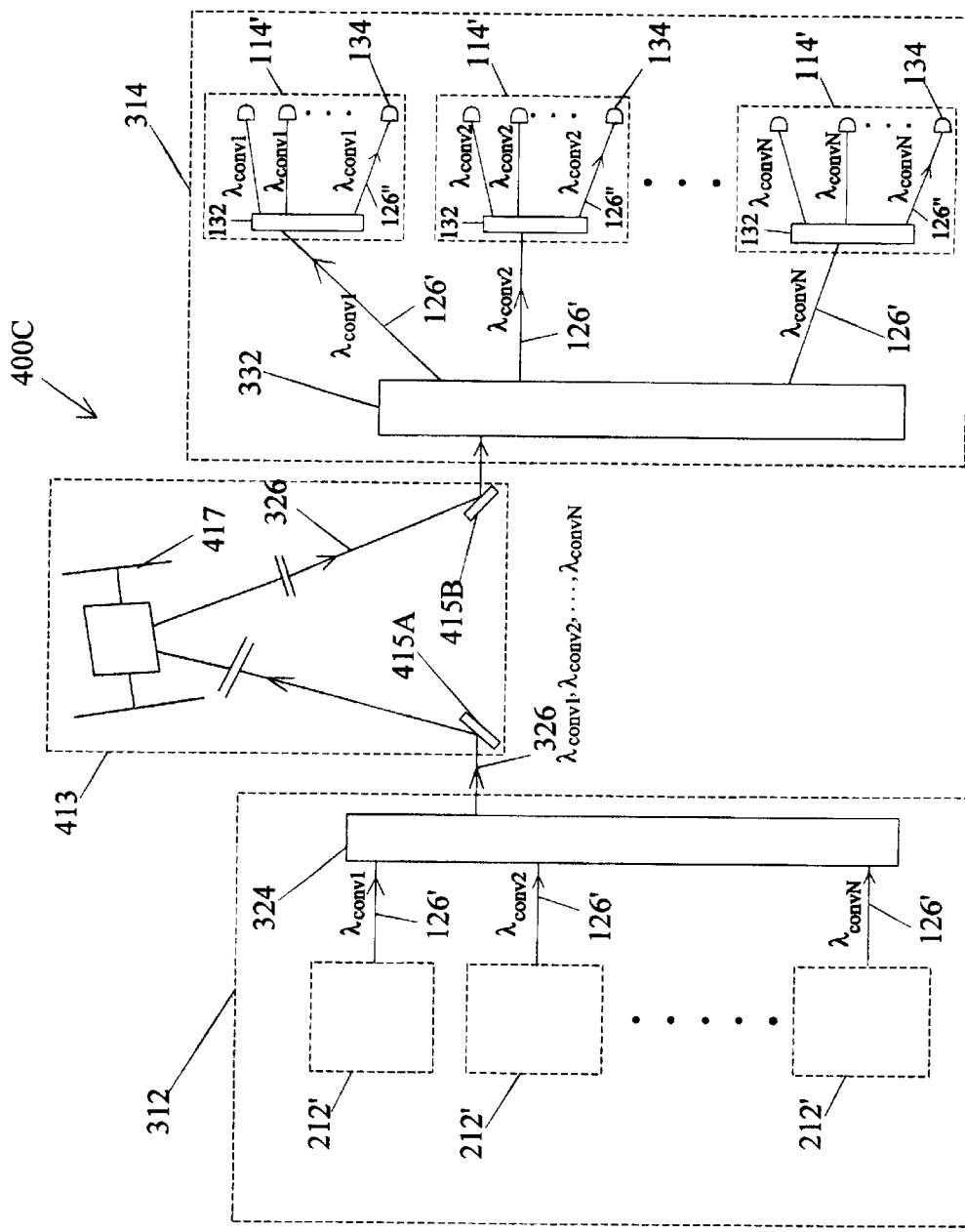

Attention is now directed to FIGS. 5A–5C, which illustrate alternative embodiments of an optical communication system designed in accordance with the present invention. FIGS. 5A–5C show optical communication systems 400A–400C, which correspond to high speed data links 100, 200 and 300 of FIGS. 1–3, respectively, where optical fiber 113 is generally replaced by a satellite transmission system 413 in each of FIGS. 1–3. The transmitter and receiver arrangements of FIGS. 5A–5C are essentially the same as those shown in FIGS. 1–3, respectively, therefore explanation of FIGS. 5A–5C is restricted to the details of the satellite transmission system.

Satellite transmission system 413 in FIGS. 5A–5C includes a reflector 415A, which directs the optical pulses from the corresponding transmitter arrangement toward a satellite 417. Satellite 417 then redirects the optical pulses toward a desired location where the redirected optical pulses are intercepted by an interceptor arrangement 415B. The optical pulses intercepted by interceptor arrangement 415B are received by the corresponding receiving arrangement. Reflector 415A and interceptor arrangement 415B are, for example, conformable mirrors (such as the micro-machined membrane mirror manufactured by SY Technology). Conformable mirrors are useful in the satellite transmission system of FIGS. 5A–5C because they can be used to compensate for possible distortion of the optical pulses. Such distortion in the optical pulses are potentially produced during transmission to and from the satellite due to, for example, atmospheric disturbances. In the case of the embodiments of the optical communication systems shown in FIGS. 5A–5C, wavelength converting device 125 in each of the transmitter arrangements may be adjusted to produce optical pulses at wavelengths appropriate for satellite communications, such as in the far-infrared wavelengths. Moreover, reflector 415A, interceptor arrangement 415B and/or satellite 417 can include an off-axis paraboloid (may be conformable) for focusing or collimating the optical pulses. The conformable mirror and/or off-axis paraboloid as well as other components used in satellite transmission system 413 should be compatible with wavelengths used in free space communication systems such as, for example, wavelengths in the mid-infrared range (3.5 $\mu$m, 8 to 12 $\mu$m, etc.). For example, wavelength converting device 125 can be configured to generate optical pulses 126 in the aforementioned mid-infrared range. Alternatively, a light source capable of producing light 122 in the mid-infrared range can be used as light source 120 in combination with a superconducting material compatible with the mid-infrared range as superconducting arrangement 118 such that frequency converting device 125 may be eliminated altogether. In other words, if light source 120 produces light in the mid-infrared range, superconducting arrangement 118 can be used to produce optical pulses 123 in the mid-infrared range such that optical pulses 123 may be directed toward satellite 417 without the need for frequency converting device 125. An example of suitable superconducting materials include mercury-based superconductor materials, which have critical temperatures of 134° K. and 164° K. under pressure. According to the Bardeen Cooper Schreiffer theory a superconductor with a critical temperature of 164° K. would have a critical wavelength of 11 $\mu$m. Therefore a superconductor arrangement 118 made form strained mercury cuprates can be used with light 122 with wavelengths greater than 11 $\mu$m. In this way, the high speed data link of the present invention is applicable to free-space communication systems as well as for optical fiber-based systems.

Figure 6:
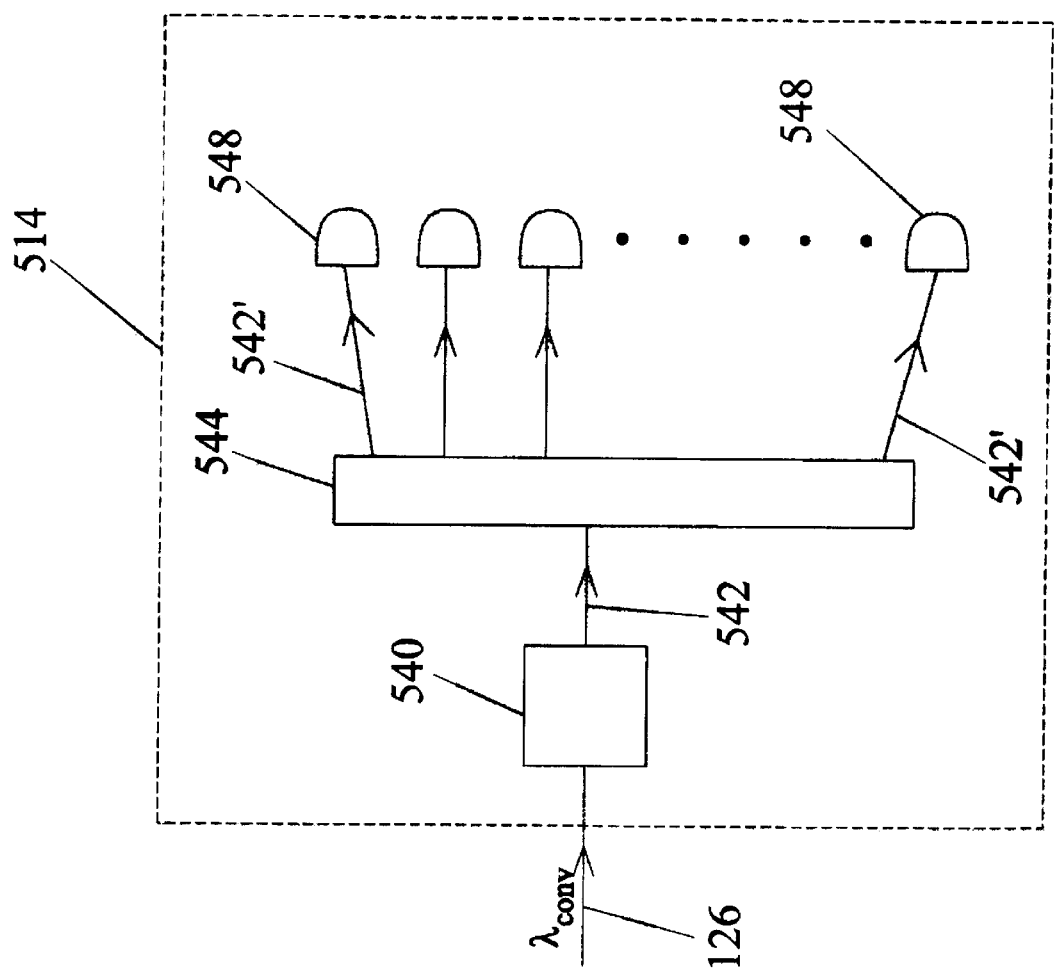
FIG. 6 is a diagrammatic illustration of an embodiment of an electrical receiver suitable for use in the present invention.

Turning now to FIG. 6, an alternative option to the aforedescribed optical receivers 114 and 114' is shown. FIG. 6 illustrates a receiver 514, which is based on a superconducting detector 540 and is suitable for use in the high speed data link of the present invention. Such use of superconducting films as bolometers or photodetectors are known in the art (see, for example, U.S. Pat. No. 5,155,093 issued to Den et al., U.S. Pat. No. 5,600,172 issued to McDevitt et al. and Roman Soblewski, "Ultrafast dynamics of nonequilibrium quasiparticles in high-temperature superconductors," *Superconducting and Related Oxides: Physics and Nanoengineering III*, ed. by I. Bozovic and D. Pavuna, *Proc. SPIE*, 3481, 480–491 (1998)). When a train of light pulses containing optical data, such as optical pulses 126 of FIG. 1, is incident on superconducting detector 540, optical pulses 126 are converted into a train of voltage spikes 542. Voltage spikes 542 are received by an electrical demultiplexer 544. Electrical demultiplexer 544 performs a task analogous to AO demultiplexer 132 of FIG. 1 in that, where as AO demultiplexer 132 divides optical pulses 126 into a plurality of low data rate, optical pulses 126', electrical demultiplexer 544 divides voltage spikes 542 into a plurality of low data rate, voltage spikes 542'. Voltage spikes 542' are received by a plurality of electrical detectors 548, which can be low speed electrical detectors that are commercially available. Receiver 514 of FIG. 6 is usable in situations in which it may be desirable to use an electrical signal detection scheme rather than an optical signal detection scheme.

Since the high speed data link and associated method disclosed herein may be provided in a variety of different configurations and the method may be practiced in a variety of different ways, it should be understood that the present invention may be embodied in many other specific ways without departing from the spirit or scope of the invention. For example, an optical detector may be configured in essentially unlimited number of ways to cooperate with an AO demultiplexer in such a way that a series of optical pulses are divided into lower rate, optical pulses by the AO demultiplexer and detected by the optical detector. Furthermore, additional optical devices such as, but not limited to, optical amplifiers, switches, routers, and repeaters may be inserted in-line with an optical fiber for transmitting optical pulses from a transmitter arrangement to a receiver arrangement. Still further, the optical fiber may be eliminated as the transmission medium between the transmitter and receiver arrangements. In this way, wavelengths outside of the optical fiber transmission window can be used and the data link of the present invention becomes applicable to data transmission using electromagnetic waves outside of the optical wavelength range (microwave data transmission, for example). Such modifications are considered to be within the scope of the present invention so long as the teachings herein are applied. Therefore, the present examples are to be considered as illustrative and not restrictive, and the invention is not to be limited to the details given herein, but may be modified within the scope of the appended claims.

What is claimed is:

1. A high speed data link, comprising:
   (a) a transmitting arrangement having a transmitter output, said transmitting arrangement including
      (i) a source of light having a certain wavelength,
      (ii) a layer of superconductive material through which said light from said source must pass before said light can reach the transmitter output, said superconductive material being switchable between a superconducting state in which said light cannot pass therethrough and a non-superconducting state in which said light can pass therethrough, (iii) an arrangement for switching said superconductive material between its superconducting and non-superconducting states to provide a train of light pulses having said certain wavelength and containing optical data, and (iv) a wavelength changing device optically coupled with said layer of superconductive material for changing the wavelength of said light pulses and providing a train of wavelength changed light pulses containing optical data at the transmitter output;

(b) an optical fiber, one end of which optical fiber is optically coupled with said transmitter output, for directing said train of wavelength changed light pulses away from said transmitting arrangement; and (c) a receiving arrangement optically coupled with an opposing end of said optical fiber, said receiving arrangement including (i) an all-optical demultiplexer for dividing said train of wavelength changed light pulses into a series of sub-trains of wavelength changed light pulses, and (ii) a series of optical receivers, each of which optical receivers is designed to detect at least one of said sub-trains of wavelength changed light pulses out of the series of sub-trains of wavelength changed light pulses.

2. The high speed data link according to claim 1 wherein a minimum wavelength of the light from said source is limited to a wavelength at which said superconductive material is able to act on the light to produce said light pulses as a result of the superconductive material being switched between its superconductive and non-superconductive states.

3. The high speed data link according to claim 2 wherein the minimum wavelength of the light from said source is approximately 2 microns.

4. The high speed data link according to claim 3 wherein said source is a quantum cascade laser.

5. The high speed data link according to claim 3 wherein said source is a bismuth antimony laser.

6. The high speed data link according to claim 1 wherein a minimum wavelength of the light from said source is limited to a wavelength at which said superconductive material is able to act on the light to produce said light pulses as a result of the superconductive material being switched between its superconductive and non-superconductive states.

7. The high speed data link according to claim 6 wherein said wavelength changing device is configured to reduce the wavelength of said light pulses to between approximately 0.5 and 2 microns.

8. The high speed data link according to claim 1 wherein said arrangement for switching said superconductive material includes (a) means for providing input pulses of light and (b) means for switching said superconductive material between its superconducting and non-superconducting states according and in response to the input pulses.

9. A high speed data link, comprising:

(A) a transmitting arrangement having a transmitter output, said transmitting arrangement including (i) a series of light modulating devices for generating a series of trains of light pulses over a specified range of wavelengths, each light modulating device having a light output and providing at its light output one of said trains of light pulses, said light pulses of each of said trains of light pulses having an assigned wavelength out of said specified range of wavelengths, each light modulating device including (a) a source of light having a given wavelength, (b) a layer of superconductive material through which said light from said source must pass before said light can reach the light output of that light modulating device, said superconductive material being switchable between a superconducting state in which said light cannot pass therethrough and a non-superconducting state in which said light can pass therethrough, (c) an arrangement for switching said superconductive material between its superconducting and non-superconducting states to provide one of said trains of light pulses having said given wavelength and containing optical data, and (d) a wavelength changing device optically coupled with said layer of superconductive material for changing the wavelength of said light pulses from said given wavelength into said assigned wavelength to provide a train of wavelength changed light pulses containing optical data at said light output such that no two light modulating devices in said series of light modulating devices generate light pulses at the same assigned wavelength out of said specified range of wavelengths, and (ii) a WDM multiplexer optically coupled with the light outputs of the series of light modulating devices for reading said series of trains of wavelength changed light pulses in parallel and combining said series of trains of wavelength changed light pulses into a multiplexed signal containing optical data at the transmitter output of said transmitting arrangement;

(B) an optical fiber for directing said multiplexed signal away from said transmitting arrangement, one end of which optical fiber is optically coupled with said transmitter output; and (C) a receiving arrangement including (i) a WDM demultiplexer optically coupled with an opposing end of said optical fiber for separating said multiplexed signal back into said series of trains of wavelength changed light pulses, and (ii) a series of light receiving devices configured to receive said series of trains of wavelength changed light pulses, each of said receiving arrangements being optically coupled with said WDM demultiplexer and being designed to receive at least one of said trains of wavelength changed light pulses of a particular wavelength out of the specified range of wavelengths, each of said receiving arrangements including (a) an all-optical demultiplexer for dividing said train of wavelength changed light pulses into a series of sub-trains of wavelength changed light pulses, and (b) a series of optical receivers, each of which optical receivers is designed to detect at least one of said sub-trains of wavelength changed light pulses out of the series of sub-trains of wavelength changed light pulses.

10. A high speed data link according to claim 9 wherein a minimum wavelength of the light from said source is limited to a wavelength at which said superconductive material is able to act on the light to produce said light pulses as a result of the superconductive material being switched between its superconductive and non-superconductive states.

11. The high speed data link according to claim 10 wherein the wavelength of the light from said source of each of said light modulating devices is no less than approximately 2 microns.

12. The high speed data link according to claim 11 wherein said source of at least one of said light modulating devices is a quantum cascade laser.

13. The high speed data link according to claim 11 wherein said source of at least one of said light modulating devices is a bismuth antimony laser.

14. The high speed data link according to claim 9 wherein the wavelength changing device is configured to change the wavelength of the light pulses according to an ability of said optical fiber to efficiently carry said wavelength changed light pulses without significant attenuation or dispersion.

15. The high speed data link according to claim 9 wherein said wavelength changing device is configured to reduce the wavelength of said light pulses to between approximately 0.5 and 2 microns.

16. The high speed data link according to claim 9 wherein said arrangement for switching said superconductive material between its superconducting and non-superconducting states of each of said light modulating devices includes
  (a) means for providing input pulses of light and
  (b) means for switching said superconductive material between its superconducting and non-superconducting states according and in response to the input pulses.

17. The high speed data link according to claim 9 wherein said wavelength changing device in at least one of said light modulating devices includes
  (a) a nonlinear optical crystal and
  (b) a pump laser for producing pump laser light having a pump wavelength, which pump wavelength is selected in accordance with the nonlinear optical crystal to change the wavelength of said light pulses from said given wavelength into said assigned wavelength at said light output.

18. The high speed data link according to claim 17 wherein said pump laser tunable such that the pump wavelength is tunable and, consequently, the assigned wavelength of said light pulses produced at the light output of that light modulating device is tunable.

19. The high speed data link according to claim 17 wherein said nonlinear optical crystal is interchangeable with an alternate nonlinear optical crystal such that the assigned wavelength of said light pulses produced at the light output of that light modulating device is variable.

20. The high speed data link according to claim 17 wherein the nonlinear optical crystal of a first one of said wavelength changing devices in said series of light modulating devices is substantially identical to the nonlinear optical crystal of a second one of said wavelength changing devices in said series of light modulating devices.

21. The high speed data link according to claim 20 wherein said first wavelength changing device includes a different pump laser from the pump laser of said second wavelength changing device, each of said pump lasers having a selected pump wavelength to change the wavelength of said light pulses from said given wavelength into said assigned wavelength at the light output of that light modulating device.

22. The high speed data link according to claim 20 wherein said first and second wavelength changing devices include substantially identical pump lasers, each of said pump lasers being tunable and the pump wavelength of each of said pump lasers being tuned to change the wavelength of said light pulses from said given wavelength into the assigned wavelength at said light output of that light modulating device.

23. The high speed data link according to claim 17 wherein the pump laser of a first one of said wavelength changing devices in said series of light modulating devices is substantially identical to the pump laser of a second one of said wavelength changing devices in said series of light modulating devices, and wherein the first wavelength changing device includes a different nonlinear optical crystal from the nonlinear optical crystal of the second wavelength changing device, each of said nonlinear optical crystals being designed to change the wavelength of said light pulses from said given wavelength into said assigned wavelength at the light output of that light modulating device.

24. The high speed data link according to claim 17 wherein each of said source of light of said series of light modulating devices is selected such that light pulses of the assigned wavelength is produced at the light output of that light modulating device.

25. The high speed data link according to claim 24 wherein the wavelength changing device of a first one of said light modulating devices in said series of light modulating devices is substantially identical to the wavelength changing device of a second one of said light modulating devices, and wherein the first light modulating device includes a different source of light from the source of light of the second light modulating device, each of said sources of light being designed such that light pulses of the assigned wavelength is produced at the light output of that light modulating device.

26. The high speed data link according to claim 9 wherein said source of light of at least one of said light modulating devices is tunable such that the given wavelength of the light produced by that source of light is tunable and, consequently, the assigned wavelength of light pulses produced at the light output of that light modulating device is tunable.

27. The high speed data link according to claim 26 wherein the wavelength changing device of a first one of said light modulating devices in said series of light modulating devices is substantially identical to the wavelength changing device of a second one of said light modulating devices, and wherein the first and second light modulating device substantially identical sources of light, each of said sources of light being tunable and the given wavelength of the light produced by that source of light being tuned such that light pulses of the assigned wavelength is produced at the light output of that light modulating device.

28. A method for providing a high speed data link, said method comprising the steps of:
  (a) transmitting a train of light pulses containing optical data, said transmitting step including the steps of
    (i) generating light having said certain wavelength,
    (ii) directing said light onto a layer of superconductive material, said superconductive material being switchable between a superconducting state in which said light cannot pass therethrough and a non-superconducting state in which said light can pass therethrough,
    (iii) switching said superconductive material between its superconducting and non-superconducting states for generating a train of light pulses having said certain wavelength and containing optical data, and
    (iv) changing the wavelength of said light pulses to provide a train of wavelength changed light pulses containing optical data;

(b) directing said train of wavelength changed light pulses to a desired location; and (c) receiving said train of wavelength changed light pulses at said desired location, said receiving step including the steps of
  (i) dividing said train of wavelength changed light pulses into a series of sub-trains of wavelength changed light pulses, and
  (ii) detecting said series of wavelength-changed light pulses using a series of optical receivers, each of which optical receivers is designed to detect at least one of said sub-trains of wavelength changed light pulses out of the series of sub-trains of wavelength changed light pulses.

29. The method according to claim 28 wherein said step of directing said train of wavelength changed light pulses to a desired location includes the step of using an optical fiber.

30. The method according to claim 28 wherein said step of switching said superconductive material between its superconducting and non-superconducting states includes the steps of:
  (a) providing input pulses of light; and
  (b) switching said superconductive material between its superconducting and non-superconducting states according and in response to the input pulses.

31. A method for providing a high speed data link, said method comprising the steps of:
  (a) transmitting a multiplexed signal containing optical data, said transmitting step including the steps of
    (i) generating light having a given wavelength,
    (ii) directing said light onto a layer of superconductive material, said superconductive material being switchable between a superconducting state in which said light cannot pass therethrough and a non-superconducting state in which said light can pass therethrough,
    (iii) switching said superconductive material between its superconducting and non-superconducting states to generate a train of light pulses having said given wavelength and containing optical data,
    (iv) changing the wavelength of said light pulses from said given wavelength to an assigned wavelength out of a specified range of wavelengths,
    (v) repeating steps (i)–(iv) to provide a series of trains of wavelength changed light pulses, each of said trains of wavelength changed light pulses containing optical data and having a distinct, assigned wavelength out of said specified range of wavelengths, such that no two trains of wavelength changed light pulses in the series of trains of wavelength changed light pulses have the same assigned wavelength out of said specified range of wavelengths,
    (vi) reading said series of trains of wavelength changed light pulses in parallel, and
    (vii) combining said series of trains of wavelength changed light pulses into a multiplexed signal containing optical data;
  (b) directing said multiplexed signal to a desired location; and
  (c) receiving said multiplexed signal at said desired location, said receiving step including the steps of
    (i) separating said received, multiplexed signal back into said series of trains of wavelength changed light pulses;
    (ii) dividing each of said trains of wavelength changed light pulses into a series of sub-trains of wavelength changed light pulses; and
    (iii) detecting said series of sub-trains of wavelength changed light pulses using a series of optical receivers, each of which optical receivers is designed to detect at least one of said sub-trains of wavelength changed light pulses out of the series of sub-trains of wavelength changed light pulses of a particular, assigned wavelength out of said specified range of wavelengths.

32. The method according to claim 31 wherein said step of directing said multiplexed signal to a desired location includes the step of using an optical fiber.

33. The method according to claim 31 wherein said step of switching said superconductive material between its superconducting and non-superconducting states includes the steps of:
  (a) providing input pulses of light;
  (b) switching said superconductive material between its superconducting and non-superconducting states according and in response to the input pulses.

34. The method according to claim 31 wherein said step of changing the wavelength of said light pulses from said given wavelength to an assigned wavelength includes the steps of
  (a) directing the light pulses into a nonlinear optical crystal, and
  (b) optically pumping the nonlinear optical crystal with a pump laser, the pump laser having a pump wavelength such that the wavelength of the light pulses is changed from the given wavelength to the assigned wavelength.

35. The method according to claim 34 wherein said step of optically pumping the nonlinear optical crystal with a pump laser includes the step of selecting the pump wavelength such that the wavelength of the light pulses is changed from the given wavelength to the assigned wavelength.

36. The method according to claim 34 wherein said step of generating light having a given wavelength includes the step of selecting the wavelength of the generated light in accordance with the nonlinear optical crystal and the pump laser.

37. An optical communication system for use with a communication satellite, said system comprising:
  (a) means for transmitting a train of light pulses containing optical data, said transmitting means having a transmitter output and including
    (i) a source of light having a certain wavelength,
    (ii) a layer of superconductive material through which said light from said source must pass before said light can reach the transmitter output, said superconductive material being switchable between a superconducting state in which said light cannot pass therethrough and a non-superconducting state in which said light can pass therethrough,
    (iii) an arrangement for switching said superconductive material between its superconducting and non-superconducting states in for providing a train of light pulses having said certain wavelength and containing optical data, and
    (iv) a wavelength changing device optically coupled with said layer of superconductive material for changing the wavelength of said light pulses and providing a train of wavelength changed light pulses containing optical data at the transmitter output;
  (b) means for directing said train of wavelength changed light pulses from the transmitter output to said communication satellite, which communication satellite redirects said train of wavelength changed light pulses toward a desired location;

(c) means for intercepting said train of redirected, wavelength changed light pulses from the communication satellite at the desired location; and (d) means for receiving said train of redirected, wavelength changed light pulses intercepted by said intercepting means, said receiving means including (i) an all-optical demultiplexer for dividing said train of redirected, wavelength changed light pulses into a series of sub-trains of wavelength changed light pulses, and (ii) a series of optical receivers, each of which optical receivers is designed to detect at least one of said sub-trains of wavelength changed light pulses out of the series of sub-trains of wavelength changed light pulses.

38. The optical communication system of claim 37 wherein said directing means is adjustable to compensate for possible distortion in said wavelength changed light pulses, said distortion potentially being produced during transmission of the wavelength changed light pulses to the communication satellite.

39. The optical communication system of claim 38 wherein said directing means is a conformable mirror.

40. The optical communication system of claim 37 wherein said intercepting means is adjustable to compensate for possible distortion in said redirected, wavelength changed light pulses, said distortion potentially being produced during transmission of the redirected, wavelength changed light pulses from the communication satellite to said intercepting means.

41. The optical communication system of claim 40 wherein said intercepting means is a conformable mirror.

42. The optical communication system of claim 37 wherein said arrangement for switching said superconductive material between its superconducting and non-superconducting states of each of said light modulating devices includes (a) means for providing input pulses of light and (b) means for switching said superconductive material between its superconducting and non-superconducting states according and in response to the input pulses.

43. An optical communication system for use with a communication satellite, said system comprising:

(A) means for transmitting a multiplexed signal containing optical data, said transmitting means having a transmitter output and including (i) a series of light modulating devices for generating a series of trains of light pulses over a specified range of wavelengths, each light modulating device having a light output and providing at its light output one of said trains of light pulses, said light pulses of each of said trains of light pulses having an assigned wavelength out of said specified range of wavelengths, each light modulating device including (a) a source of light having a given wavelength, (b) a layer of superconductive material through which said light from said source must pass before said light can reach the light output of that light modulating device, said superconductive material being switchable between a superconducting state in which said light cannot pass therethrough and a non-superconducting state in which said light can pass therethrough, (c) an arrangement for switching said superconductive material between its superconducting and non-superconducting states to provide one of said trains of light pulses having said given wavelength and containing optical data, and (d) a wavelength changing device optically coupled with said layer of superconductive material for changing the wavelength of said light pulses from said given wavelength into said assigned wavelength to provide a train of wavelength changed light pulses containing optical data at said light output such that no two light modulating devices in said series of light modulating devices generate light pulses at the same assigned wavelength out of said specified range of wavelengths, and (ii) a WDM multiplexer optically coupled with the light outputs of the series of light modulating devices for reading said series of trains of wavelength changed light pulses in parallel and combining said series of trains of wavelength changed light pulses into a multiplexed signal at the transmitter output of said transmitting means;

(B) means for directing said multiplexed signal from the transmitter output to said communication satellite, which satellite redirects said multiplexed signal toward a desired location;

(C) means for intercepting said redirected, multiplexed signal from the satellite at the desired location; and (D) means for receiving said redirected, multiplexed signal intercepted by said intercepting means, said receiving means including (i) a WDM demultiplexer optically coupled with said intercepting means for separating said multiplexed signal back into said series of trains of wavelength changed light pulses, and (ii) a series of light receiving devices configured to receive said series of trains of wavelength changed light pulses, each of said receiving arrangements being optically coupled with said WDM demultiplexer and being designed to receive at least one of said trains of wavelength changed light pulses of a particular wavelength out of the specified range of wavelengths, each of said receiving arrangements including (a) an all-optical demultiplexer for dividing said train of wavelength changed light pulses into a series of sub-trains of wavelength changed light pulses, and (b) a series of optical receivers, each of which optical receivers is designed to detect at least one of said sub-trains of wavelength changed light pulses out of the series of sub-trains of wavelength changed light pulses.

44. The optical communication system of claim 43 wherein said directing means is adjustable to compensate for possible distortion in said multiplexed signal, said distortion potentially being produced during transmission of the multiplexed signal to the communication satellite.

45. The optical communication system of claim 44 wherein said directing means is a conformable mirror.

46. The optical communication system of claim 43 wherein said intercepting means is adjustable to compensate for possible distortion in said redirected, multiplexed signal, said distortion potentially being produced during transmission of the redirected, multiplexed signal from the communication satellite to said intercepting means.

47. The optical communication system of claim 46 wherein said intercepting means is a conformable mirror.

48. The optical communication system of claim 43 wherein said arrangement for switching said superconductive material between its superconducting and non-superconducting states of each of said light modulating devices includes
  (a) means for providing input pulses of light and
  (b) means for switching said superconductive material between its superconducting and non-superconducting states according and in response to the input pulses.

49. A method for providing an optical communication system for use with a communication satellite, said method comprising the steps of:
  (a) transmitting a train-of light pulses containing optical data, said transmitting step including the steps of
    (i) generating light having a certain wavelength,
    (ii) directing said light onto a layer of superconductive material, said superconductive material being switchable between a superconducting state in which said light cannot pass therethrough and a non-superconducting state in which said light can pass therethrough,
    (iii) switching said superconductive material between its superconducting and non-superconducting states for generating a train of light pulses having said certain wavelength and containing optical data, and
    (iv) changing the wavelength of said light pulses to produce a train of wavelength changed light pulses containing optical data;
  (b) directing said train of wavelength changed light pulses from the transmitter output to said communication satellite, which communication satellite redirects said wavelength changed light pulses toward a desired location;
  (c) intercepting said train of redirected, wavelength changed light pulses from the communication satellite at the desired location; and
  (d) receiving said train of intercepted, redirected, wavelength changed light pulses, said receiving step including the steps of
    (i) dividing said train of intercepted, redirected, wavelength changed light pulses into a series of sub-trains of wavelength changed light pulses, and
    (ii) detecting said series of sub-trains of wavelength-changed light pulses using a series of optical receivers, each of which optical receivers is designed to detect at least one of said sub-trains of wavelength changed light pulses out of the series of sub-trains of wavelength changed light pulses.

50. The method of claim 49 wherein said directing step includes the step of using a conformable mirror to compensate for possible distortion in said wavelength changed light pulses, said distortion potentially being produced during transmission of the wavelength changed light pulses to the communication satellite.

51. The method of claim 49 wherein said intercepting step includes the step of using a conformable mirror to compensate for possible distortion in said redirected, wavelength changed light pulses, said distortion potentially being produced during transmission of the redirected, wavelength changed light pulses from the communication satellite to said intercepting means.

52. The method of claim 49 wherein said step of switching said superconductive material between its superconducting and non-superconducting states includes the steps of:
  (a) providing input pulses of light; and
  (b) switching said superconductive material between its superconducting and non-superconducting states according and in response to the input pulses.

53. A method for providing an optical communication system for use with a communication satellite, said method comprising the steps of:
  (a) transmitting a multiplexed signal containing optical data, said transmitting step including the steps of
    (i) generating light having a given wavelength,
    (ii) directing said light onto a layer of superconductive material, said superconductive material being switchable between a superconducting state in which said light cannot pass therethrough and a non-superconducting state in which said light can pass therethrough,
    (iii) switching said superconductive material between its superconducting and non-superconducting states to generate a train of light pulses having said given wavelength and containing optical data,
    (iv) changing the wavelength of said light pulses from said given wavelength to an assigned wavelength out of a specified range of wavelengths,
    (v) repeating steps (i)–(iv) to provide a series of trains of wavelength changed light pulses, each of said trains of wavelength changed light pulses containing optical data and having a distinct, assigned wavelength out of said specified range of wavelengths, such that no two trains of wavelength changed light pulses in the series of trains of wavelength changed light pulses have the same assigned wavelength out of said specified range of wavelengths,
    (vi) reading said series of trains of wavelength changed light pulses in parallel, and
    (vii) combining said series of trains of wavelength changed light pulses into a multiplexed signal;
  (b) directing said multiplexed signal from the transmitter output to said communication satellite, which communication satellite redirects said multiplexed signal toward a desired location;
  (c) intercepting said redirected, multiplexed signal from the communication satellite at said desired location; and
  (d) receiving said intercepted, redirected, multiplexed signal, said receiving step including the steps of
    (i) separating said intercepted, received, multiplexed signal back into said series of trains of wavelength changed light pulses;
    (ii) dividing each of said trains of wavelength changed light pulses into a series of sub-trains of wavelength changed light pulses; and
    (iii) detecting said series of sub-trains of wavelength changed light pulses using a series of optical receivers, each of which optical receivers is designed to detect at least one of said sub-trains of wavelength changed light pulses out of the series of sub-trains of wavelength changed light pulses of a particular, assigned wavelength out of said specified range of wavelengths.

54. The method of claim 53 wherein said directing step includes the step of using a conformable mirror to compensate for possible distortion in said wavelength changed light pulses, said distortion potentially being produced during transmission of the wavelength changed light pulses to the communication satellite.

55. The method of claim 53 wherein said intercepting step includes the step of using a conformable mirror to compensate for possible distortion in said redirected, wavelength changed light pulses, said distortion potentially being produced during transmission of the redirected, wavelength changed light pulses from the communication satellite to said intercepting means.

56. The method of claim 53 wherein said step of switching said superconductive material between its superconducting and non-superconducting states includes the steps of:
(a) providing input pulses of light; and
(b) switching said superconductive material between its superconducting and non-superconducting states according and in response to the input pulses.

57. A high speed data link, comprising:
(a) a transmitting arrangement having a transmitter output, said transmitting arrangement including
  (i) a source of light having a certain wavelength,
  (ii) a layer of superconductive material through which said light from said source must pass before said light can reach the transmitter output, said superconductive material being switchable between a superconducting state in which said light cannot pass therethrough and a non-superconducting state in which said light can pass therethrough,
  (iii) an arrangement for switching said superconductive material between its superconducting and non-superconducting states to provide a train of light pulses having said certain wavelength and containing optical data, and
  (iv) a wavelength changing device optically coupled with said layer of superconductive material for changing the wavelength of said light pulses and providing a train of wavelength changed light pulses containing optical data at the transmitter output;
(b) an optical fiber, one end of which optical fiber is optically coupled with said transmitter output, for directing said train of wavelength changed light pulses away from said transmitting arrangement; and
(c) a receiving arrangement optically coupled with an opposing end of said optical fiber, said receiving arrangement including
  (i) a superconducting bolometer for converting said train of wavelength changed light pulses into a train of voltage spikes and translating said optical data into electrical data,
  (ii) an electrical demultiplexer for dividing said train of voltage spikes into a series of sub-trains of voltage spikes, and
  (iii) a series of electrical receivers, each of which electrical receivers is designed to detect at least one of said sub-trains of voltage spikes out of the series of sub-trains of voltage spikes.

58. A high speed data link, comprising:
(A) a transmitting arrangement having a transmitter output, said transmitting arrangement including
  (i) a series of light modulating devices for generating a series of trains of light pulses over a specified range of wavelengths, each light modulating device having a light output and providing at its light output one of said trains of light pulses, said light pulses of each of said trains of light pulses having an assigned wavelength out of said specified range of wavelengths, each light modulating device including
    (a) a source of light having a given wavelength,
    (b) a layer of superconductive material through which said light from said source must pass before said light can reach the light output of that light modulating device, said superconductive material being switchable between a superconducting state in which said light cannot pass therethrough and a non-superconducting state in which said light can pass therethrough,
    (c) an arrangement for switching said superconductive material between its superconducting and non-superconducting states to provide one of said trains of light pulses having said given wavelength and containing optical data, and
    (d) a wavelength changing device optically coupled with said layer of superconductive material for changing the wavelength of said light pulses from said given wavelength into said assigned wavelength to provide a train of wavelength changed light pulses containing optical data at said light output such that no two light modulating devices in said series of light modulating devices generate light pulses at the same assigned wavelength out of said specified range of wavelengths, and p2 (ii) a WDM multiplexer optically coupled with the light outputs of the series of light modulating devices for reading said series of trains of wavelength changed light pulses in parallel and combining said series of trains of wavelength changed light pulses into a multiplexed signal containing optical data at the transmitter output of said transmitting arrangement;
(B) an optical fiber for directing said multiplexed signal away from said transmitting arrangement, one end of which optical fiber is optically coupled with said transmitter output; and
(C) a receiving arrangement including
  (i) a WDM demultiplexer optically coupled with an opposing end of said optical fiber for separating said multiplexed signal back into said series of trains of wavelength changed light pulses, and
  (ii) a series of light receiving devices configured to receive said series of trains of wavelength changed light pulses, each of said receiving arrangements being optically coupled with said WDM demultiplexer and being designed to receive at least one of said trains of wavelength changed light pulses of a particular wavelength out of the specified range of wavelengths, each of said receiving arrangements including
    (a) a superconducting bolometer for converting said train of wavelength changed light pulses into a train of voltage spikes and translating said optical data into electrical data,
    (b) an electrical demultiplexer for dividing said train of voltage spikes into a series of sub-trains of voltage spikes, and
    (c) a series of electrical receivers, each of which electrical receivers is designed to detect at least one of said sub-trains of voltage spikes out of the series of sub-trains of voltage spikes.

59. A method for providing a high speed data link, said method comprising the steps of:
(a) transmitting a train of light pulses containing optical data, said transmitting step including the steps of
  (i) generating light having said certain wavelength,
  (ii) directing said light onto a layer of superconductive material, said superconductive material being switchable between a superconducting state in which said light cannot pass therethrough and a non-superconducting state in which said light can pass therethrough,
  (iii) switching said superconductive material between its superconducting and non-superconducting states for generating a train of light pulses having said certain wavelength and containing optical data, and (iv) changing the wavelength of said light pulses to provide a train of wavelength changed light pulses containing optical data;

(b) directing said train of wavelength changed light pulses to a desired location; and (c) receiving said train of wavelength changed light pulses at said desired location, said receiving step including the steps of (i) converting said train of wavelength changed light pulses into a train of voltage spikes, thus translating said optical data into electrical data, (ii) dividing said train of voltage spikes into a series of sub-trains of voltage spikes, and (iii) detecting said series of sub-trains of voltage spikes using a series of electrical receivers, each of which electrical receivers is designed to detect at least one of said sub-trains of voltage spikes out of the series of sub-trains of voltage spikes.

60. A method for providing a high speed data link, said method comprising the steps of:

(a) transmitting a multiplexed signal containing optical data, said transmitting step including the steps of (i) generating light having a given wavelength, (ii) directing said light onto a layer of superconductive material, said superconductive material being switchable between a superconducting state in which said light cannot pass therethrough and a non-superconducting state in which said light can pass therethrough, (iii) switching said superconductive material between its superconducting and non-superconducting states to generate a train of light pulses having said given wavelength and containing optical data, (iv) changing the wavelength of said light pulses from said given wavelength to an assigned wavelength out of a specified range of wavelengths, (v) repeating steps (i)–(iv) to provide a series of trains of wavelength changed light pulses, each of said trains of wavelength changed light pulses containing optical data and having a distinct, assigned wavelength out of said specified range of wavelengths, such that no two trains of wavelength changed light pulses in the series of trains of wavelength changed light pulses have the same assigned wavelength out of said specified range of wavelengths, (vi) reading said series of trains of wavelength changed light pulses in parallel, and (vii) combining said series of trains of wavelength changed light pulses into a multiplexed signal containing optical data;

(b) directing said multiplexed signal to a desired location; and (c) receiving said multiplexed signal at said desired location, said receiving step including the steps of (i) separating said received, multiplexed signal back into said series of trains of wavelength changed light pulses;

(ii) converting said train of wavelength changed light pulses into a train of voltage spikes, thus translating said optical data into electrical data, (iii) dividing said train of voltage spikes into a series of sub-trains of voltage spikes, and (iv) detecting said series of sub-trains of voltage spikes using a series of electrical receivers, each of which electrical receivers is designed to detect at least one of said sub-trains of voltage spikes out of the series of sub-trains of voltage spikes.

* * * * *